United States Patent [19]
Troost et al.

[11] Patent Number: 5,510,617
[45] Date of Patent: Apr. 23, 1996

[54] PARTICLE-OPTICAL INSTRUMENT COMPRISING A DEFLECTION UNIT FOR SECONDARY ELECTRONS

[75] Inventors: Kars Z. Troost; Alexander Henstra, both of Eindhoven, Netherlands

[73] Assignee: U.S. Philips Corporation, New York, N.Y.

[21] Appl. No.: 404,706

[22] Filed: Mar. 15, 1995

[30]  Foreign Application Priority Data

Mar. 18, 1994 [EP]  European Pat. Off. .............. 94200713

[51] Int. Cl.$^6$ ........................... H01J 37/28; H01J 37/244
[52] U.S. Cl. ............................................. 250/310; 250/397
[58] Field of Search ...................... 250/310, 397

[56]  References Cited

U.S. PATENT DOCUMENTS

| | | | |
|---|---|---|---|
| 4,442,355 | 4/1984 | Tamura et al. ........................ | 250/310 |
| 4,823,005 | 4/1989 | Garth ..................................... | 250/310 |

OTHER PUBLICATIONS

J. Zach & H. Rose, "Efficient Detection of Secondary Electrons in Low–Voltage Scanning Electron Microscopy", Scanning, vol. 8, Aug. 29, 1986, pp. 285–293.

*Primary Examiner*—Jack I. Berman
*Attorney, Agent, or Firm*—Paul R. Miller

[57]  ABSTRACT

A primary beam in a scanning electron microscope (SEM) releases secondary electrons in the specimen to be studied. These electrons move back to the focusing lens against the direction of the primary beam, detection of these electrons taking place in the vicinity of said lens. A known detector comprises a Wien filter for deflecting the electrons from the optical axis to the actual detector. In accordance with the invention a SEM detector is provided with a double electric dipole. The latter leaves the primary beam undisturbed to a high degree, but very efficiently deflects the secondary electrons to the actual detector.

6 Claims, 3 Drawing Sheets

PARTICLE-OPTICAL INSTRUMENT COMPRISING A DEFLECTION UNIT FOR SECONDARY ELECTRONS

The invention relates to a particle-optical instrument which comprises a particle source for producing a beam of electrically charged particles which propagate along an optical axis of the instrument, is arranged to scan a specimen to be examined by means of the particle beam, and comprises a focusing lens for forming a focus in the vicinity of the area in which the specimen is to be arranged, which instrument also comprises a detection device for detecting electrically charged particles originating from the specimen, which detection device comprises an electric dipole whose electric field intersects the optical axis and extends transversely thereof, thus defining a field integral of the electric field over the optical axis.

BACKGROUND OF THE INVENTION

An instrument of this kind is known from an article in the magazine "SCANNING", Vol. 8, pp. 285–293, by J. Zach and H. Rose, entitled "Efficient Detection of Secondary Electrons in Low-Voltage Electron Microscopy".

Instruments of the kind set forth are known as Scanning Electron Microscopes (SEM). In a SEM a region of a specimen to be examined is scanned by a primary beam of electrons of an energy of the order of magnitude of from 1 to 100 keV. Secondary Electrons of substantially lower energy are then released in the specimen, for example an energy of the order of magnitude of from 5 to 50 eV. The energy and/or the energy distribution of these secondary electrons provides information as regards the nature and composition of the specimen. Therefore, it is useful to provide a SEM with a detection device for secondary electrons. These electrons are released at the side of the specimen at which the primary beam is incident, after which they return, against the direction of incidence of the primary electrons, approximately along the field lines of the focusing lens. When a detector is arranged in the vicinity of the secondary electrons thus moving back, such a detector will collect the secondary electrons and output an electric signal which is proportional to the flow thus detected, which signal is then used to form the (secondary electron) image of the specimen in known manner.

The detector should satisfy inter alia the condition that it may not introduce significant imaging faults (geometrical as well as chromatic) in the primary beam so as not to increase the cross-section of this beam at the area of the specimen surface, which would degrade the resolution of the SEM. Furthermore, influencing of the direction of the primary beam by the presence of the detector is undesirable.

The cited article in the magazine "SCANNING" (notably page 286, section 2: "The Dipole Detector") describes a detector in which the secondary electrons are deflected and collected by a combination of a homogeneous electric field and a homogeneous magnetic field which extends perpendicularly thereto. Such a field combination has a few drawbacks. A first drawback resides in the fact that there are circumstances in which the presence of a magnetic field in a SEM is not desirable, for example when this field extends in the vicinity of the magnetic field of the focusing lens. A further drawback resides in the fact that such a system often introduces a chromatic error in the primary beam which cannot be ignored; additional correction must then be provided. This additional correction is realised in said article by means of an additional Wien filter having a polarity which opposes that of the detector; this filter is arranged above the focusing lens (see the last paragraph of section 2 of the cited article).

SUMMARY OF THE INVENTION

It is an object of the invention to provide a scanning particle-optical instrument in which the drawbacks of influencing of the magnetic field and introduction of an additional chromatic error are avoided. To this end, the instrument in accordance with the invention is characterized in that the detection device comprises at least one further electric dipole which has been shifted in the direction of the optical axis relative to the first dipole and whose electric field at the area of the optical axis opposes that of the first dipole and has a strength such that the algebraic sum of the field integrals along the optical axis of all dipoles of the detection device is substantially zero.

Thus, a double electric dipole is obtained in which the effect of the first dipole on the primary beam is compensated by the second dipole, both in respect of beam deflection and in respect of introduction of imaging faults. A very high detection efficiency for the secondary electrons (up to an order of magnitude of 100%) is thus possible because comparatively high voltages are possible on the electric dipole. As these dipole fields are constant in each plane perpendicular to the axis of the primary beam, aberrations will also be absent far beyond this axis. Moreover, only the location of the primary beam is influenced; this displacement is of the order of magnitude of some tens of micrometers for an electric field of the order of 1 kV/m, a field length of 1 cm and an accelerating voltage of the order of 1 kV. If this displacement takes place of the focusing field constituting the final lens of the instrument, it will not influence the location of the electron focus. Should this phenomenon be disturbing after all, it can be readily corrected for by the inherently necessary alignment of this lens.

An embodiment of the invention is characterized in that the detection device comprises three electric dipoles which have been shifted in the direction of the optical axis relative to one another, the electric field of the central dipole being oriented in the opposite direction, and the field integral of said central dipole along the optical axis amounting to twice that of each of the other two dipoles.

This embodiment can be used in cases where parallel displacement of the primary electron beam is still undesirable. For said field distribution this configuration acts as a stack of two double dipoles with the effect of compensation for the displacement. Moreover, the displacement of the primary beam is now compensated for each accelerating voltage of the beam.

Another embodiment of the invention is characterized in that at least one dipole is provided with electrodes which enclose an angle of approximately 120°, viewed from the optical axis. The positive as well as the diametrically oppositely situated negative pole of this dipole are constructed as a 120° segment of circle in the present embodiment. (The intermediate segments are then maintained at the mean potential, notably ground potential). It can be demonstrated theoretically that this configuration does not have monopole, quadrupole, hexapole and octupole components. The first multipole term unequal to zero is the decapole term whose electric potential decreases as a fifth power of the distance from the axis and which, therefore, causes only a negligibly small disturbance of the pure dipole field in the vicinity of the optical axis.

Another embodiment yet of the invention is characterized in that all electrodes of the detector are electrically insulated from the surroundings. This step enables the voltage of all electrodes of the detector to be increased or decreased by the same amount. Thus, an electric monopole field can be generated such that the secondary electrons to be detected practically cannot pass through the dipole and hence escape detection. The detection efficiency is thus enhanced.

Another embodiment of the invention is characterized in that at least one of the electrodes of one of the dipoles is transmissive for electrically charged particles. This can be achieved, for example by constructing the relevant electrode by means of a gauze or a pierced plate. The electrons to be detected can then be collected via the openings in this electrode.

Another embodiment of the invention is characterized in that the dipoles of the detection device in this instrument are accommodated in the bore of an immersion lens. Because the electric dipole field is practically not dependent on the distance from the axis, the scan coils for the beam deflection in a SEM can now be arranged ahead of the dipole electrodes, since neither a shift nor a tilt of the beam is influenced by the detector field generated in accordance with the invention.

BRIEF DESCRIPTION OF THE DRAWING FIGURES

The invention will be described in detail hereinafter with reference to the Figures in which corresponding reference numerals denote similar elements. Therein:

DESCRIPTION OF THE INVENTION

Figure 1:
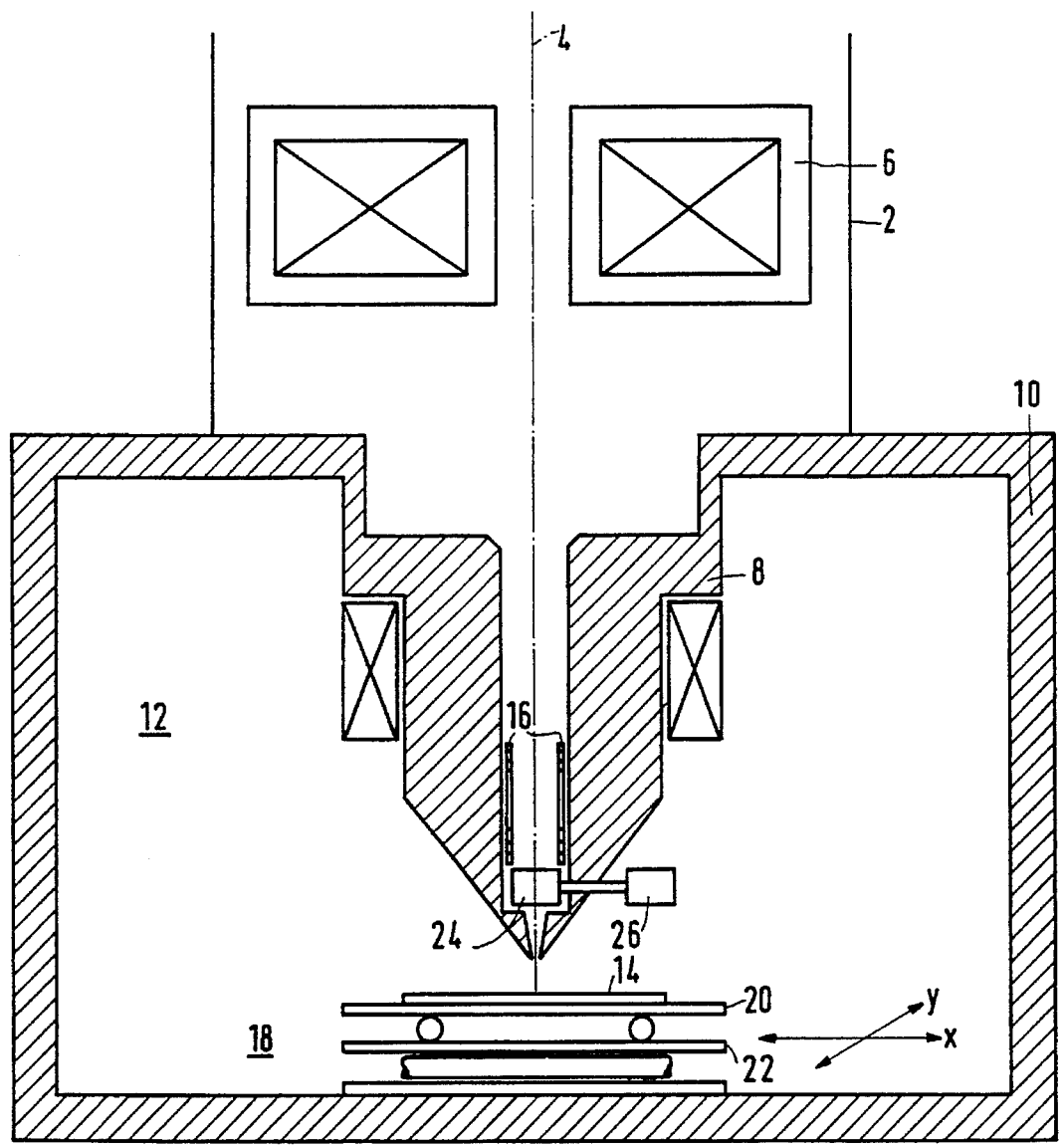
FIG. 1 is a diagrammatic representation of a particle-optical instrument in which the detector in accordance with the invention can be used.

FIG. 1 shows a particle-optical instrument in the form of a part of a column 2 of a scanning electron microscope (SEM). As is customary, in this instrument a beam of electrons is produced by an electron source (not shown in the Figure), which beam extends along the optical axis 4 of the instrument. The electron beam can pass through one or more electromagnetic lenses, such as a condenser lens 6, after which it reaches the lens 8. This lens, being a so-called monopole lens, forms part of a magnetic circuit which is also constituted by a wall 10 of a specimen chamber 12. The lens 8 is used to form an electron beam focus for scanning the specimen 14. Scanning is performed by displacing the electron beam across the specimen, in the x direction as well as the y direction, by means of scan coils 16 provided in the lens 8. The specimen 14 is accommodated on a specimen table 18 Which comprises a support 20 for the x-displacement and a support 22 for the y-displacement. A specimen area to be examined can be selected by way of these two supports. Secondary electrons which move back in the direction of the lens 8 are released from the specimen. These secondary electrons are detected by a detector (yet to be described) which is accommodated in the bore of this lens. A control unit 26 is connected to the detector in order to activate the detector and to convert the flow of detected electrons into a signal which can be used for forming an image of the specimen, for example by means of a cathode ray tube.

Figure 2:
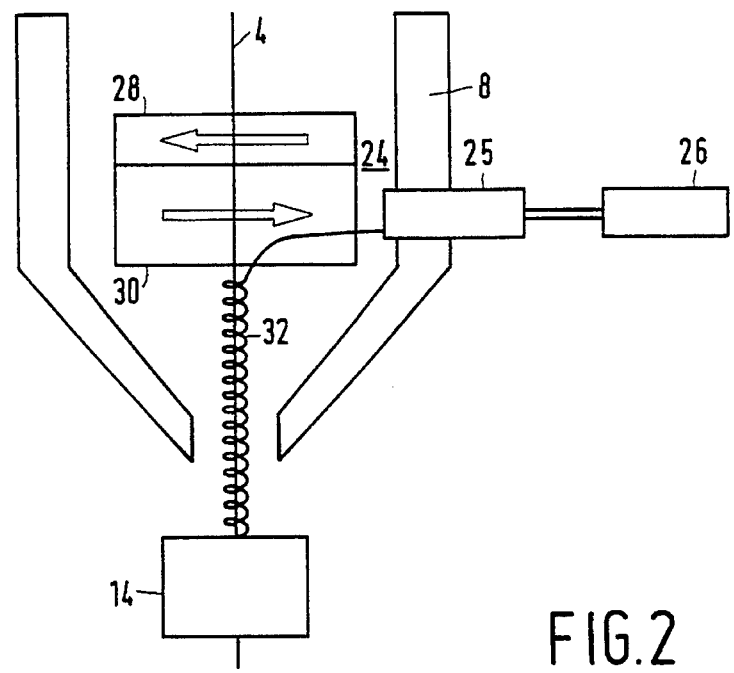
FIG. 2 is a sectional view of an immersion lens for a SEM in which a first version of the detector in accordance with the invention is accommodated.

FIG. 2 is a detailed representation of a first version of the secondary electron detector 24. The detector comprises two parts (dipoles) 28 and 30 which generate electric dipole fields which both extend perpendicularly to the optical axis 4 but are mutually opposed. These fields in principle comprise only one field component which extends perpendicularly to the optical axis (the perpendicular component), because in this case dipole fields for deflection in this direction are concerned. Field components in the direction of the optical axis are avoided as well as possible; if they are present (mainly outside the dipoles 28 and 30), they compensate one another's effect on the electrons passing through these dipoles. For each of the dipoles 28 and 30 the field integral of the perpendicular components along the optical axis 4 can be calculated. The strength of the dipole fields is chosen so that the algebraic sum of the field integrals (i.e. of the perpendicular components) is substantially zero. As a result, no net deflection of the primary electron beam occurs.

In the specimen secondary electrons are released which spiral back in the direction of the detector 24. The spiral-shaped paths extend approximately along the magnetic field lines between the immersion lens 8 and the specimen 14. These secondary electrons are detected in the actual detector 25 (for example, an Everhart-Thorley detector, i.e. a detector consisting of a scintillator with a photomultiplier tube) in which a signal is produced which is a measure of the number of secondary electrons; if desired, energy selection can then also be applied. Finally, a control unit 26 for excitation of the dipoles and for the recording and/or reproduction of the signal measured is also connected to the detector 25.

Figure 3:
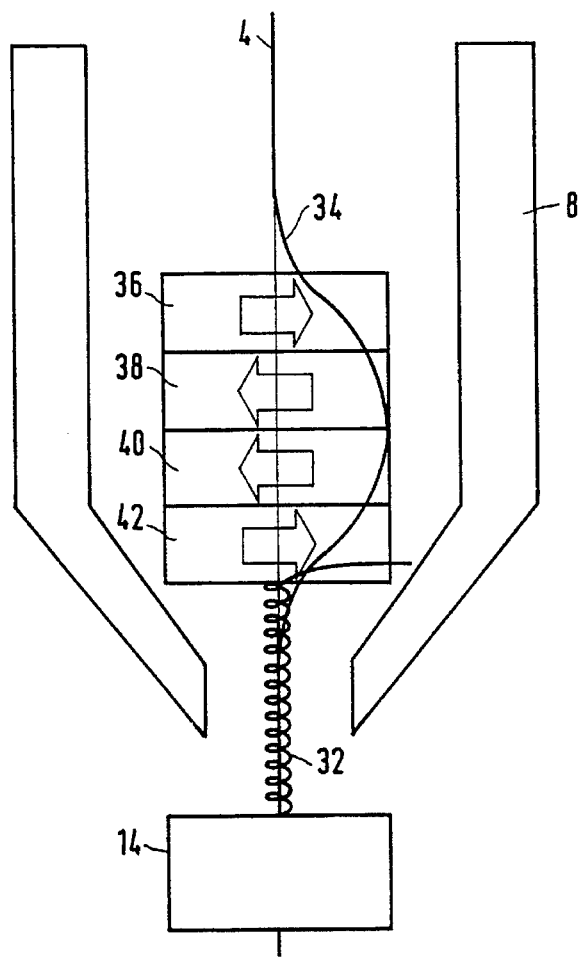
FIG. 3 is a sectional view of an immersion lens for a SEM in which a second version of the detector in accordance With the invention is accommodated.

FIG. 3 is a detailed representation of a second version of the secondary electron detector 24. This detector comprises four parts (dipoles) 36, 38, 40 and 42. Each of these dipoles generates an electric field which is in principle directed perpendicularly to the optical axis 4, components in the direction of this axis compensating one another in the manner described with reference to FIG. 2. The strength of these fields is chosen so that the algebraic sum of the field integrals is substantially zero. Thus, it is achieved not only that the net deflection of the primary electron beam equals zero, but also that the net parallel displacement is zero. Moreover, the displacement of the primary beam is now compensated for each value of the accelerating voltage of the beam. In the described configuration the dipoles 38 and 40 can be combined so as to form a single dipole, for as long as the condition that the algebraic sum of the field integrals of the dipoles is substantially zero is still satisfied. This is the case if the field integral along the optical axis of the combined dipole amounts to twice the field integral of each of the two other dipoles. Detection and recording of the signal are realised in the same way as described with reference to FIG. 2.

Figure 4A:
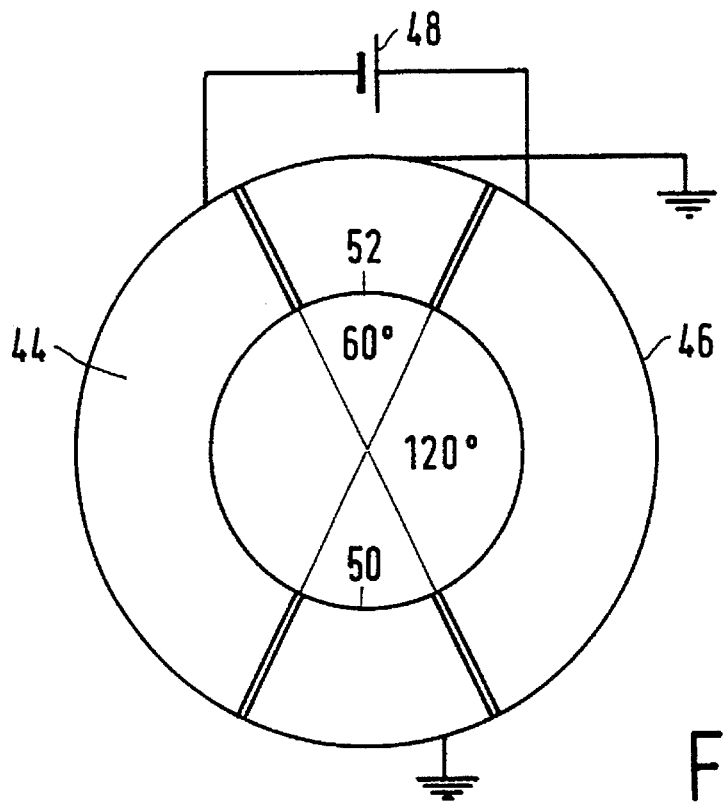
FIG. 4a is a diagrammatic view of the shape of the electrodes for a dipole detector in accordance with the invention.
Figure 4B:
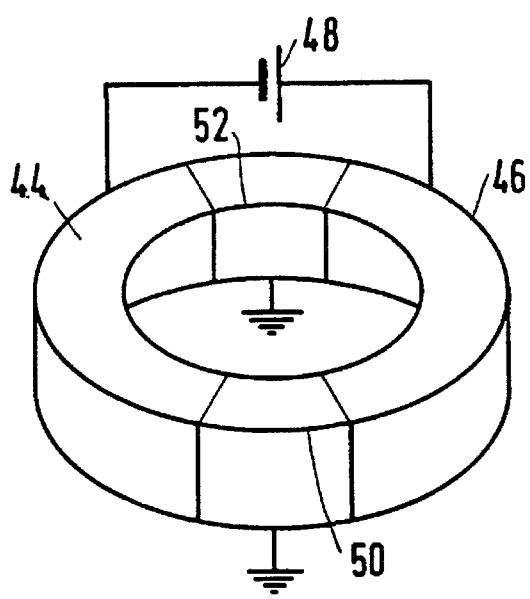
FIG. 4b is a perspective view of the shape of the electrodes for a dipole detector in accordance with the invention.

FIGS. 4a and 4b show the construction of a single dipole as used in the detector shown in the FIGS. 2 and 3. FIG. 4a is a plan view of this dipole, and FIG. 4b is a perspective view. The dipole consists of the combination of two 120° segments 44 and 46 and two 60° segments 50 and 52. A voltage difference as symbolically denoted by a voltage source 48 in the Figure is applied between the two 120° segments 44 and 46. The two 60° segments 50 and 52 are maintained at a fixed potential which has a value between that of the segment 44 and that of the segment 46. By this choice of the shape of the electrodes it is achieved that the first multipole term of the electric field around the optical axis which is not equal to zero is the decapole term which, however, decreases as a fifth power of the distance from the axis, and hence produces only a negligibly small disturbance with respect to the ideal dipole field near or on the axis.

We claim:

1. A particle-optical instrument which comprises a particle source for producing a beam (34) of electrically charged particles which propagate along an optical axis (4) of the instrument, is arranged to scan a specimen (14) to be examined by means of the particle beam (34), and comprises a focusing lens (6) for forming a beam focus in the vicinity of the area in which the specimen is to be arranged, which instrument also comprises a detection device (24, 26) for detecting electrically charged particles (32) originating from the specimen, which detection device (24, 26) comprises an electric dipole 24 whose electric field intersects the optical axis and extends transversely thereof, thus defining a field integral of the electric field over the optical axis, characterized in that the detection device 24, 26) comprises at least one further electric dipole (30) which has been shifted in the direction of the optical axis relative to the first dipole and whose electric field at the area of the optical axis opposes that of the first dipole and has a strength such that the algebraic sum of the field integrals along the optical axis of all dipoles of the detection device is substantially zero.

2. A particle-optical instrument as claimed in claim 1, characterized in that the detection device (24) comprises three electric dipoles (36; 38, 40; 42) which have been shifted in the direction of the optical axis relative to one another, the electric field of the central dipole (38, 40) being oriented in the opposite direction and the field integral of said central dipole along the optical axis amounting to twice that of each of the other two dipoles (36, 42).

3. A particle-optical instrument as claimed in claim 1, characterized in that at least one dipole is provided with electrodes (44, 46) which enclose an angle of approximately 120°, viewed from the optical axis.

4. A particle-optical instrument as claimed in claim 1, characterized in that all electrodes of the detector are electrically insulated from the surroundings.

5. A particle-optical instrument as claimed in claim 1, characterized in that at least one of the electrodes of one of the dipoles is transmissive for electrically charged particles.

6. A particle-optical instrument as claimed in claim 1, characterized in that the dipoles of the detection device in this instrument are accommodated in the bore of an immersion lens (8).

* * * * *